United States Patent
Sato et al.

(10) Patent No.: US 8,816,458 B2
(45) Date of Patent: Aug. 26, 2014

(54) PHOTOELECTRIC CONVERSION DEVICE

(75) Inventors: Takanobu Sato, Osaka (JP); Tazuko Kitazawa, Osaka (JP)

(73) Assignee: Sharp Kabushiki Kaisha, Osaka-Shi, Osaka (JP)

( * ) Notice: Subject to any disclaimer, the term of this patent is extended or adjusted under 35 U.S.C. 154(b) by 77 days.

(21) Appl. No.: 13/473,187

(22) Filed: May 16, 2012

(65) Prior Publication Data

US 2012/0313202 A1    Dec. 13, 2012

(30) Foreign Application Priority Data

Jun. 8, 2011  (JP) .................................. 2011-128434

(51) Int. Cl.
*H01L 31/0232*    (2014.01)

(52) U.S. Cl.
USPC .............. 257/432; 257/E31.126; 257/31.127; 257/E31.128; 257/E33.067

(58) Field of Classification Search
CPC ..... Y02E 10/52; Y02E 10/549; Y02E 10/548; H01L 31/0522; H01L 31/075; H01L 31/076
USPC .......... 136/246, 251, 256; 257/432, E31.126, 257/E31.127, E31.128, E33.067
See application file for complete search history.

(56) References Cited

U.S. PATENT DOCUMENTS

2006/0137735 A1*  6/2006  Kobayashi et al. ........... 136/246

FOREIGN PATENT DOCUMENTS

| JP | 2002 076414 |   | 3/2002 |
| JP | 2006-128478 | A | 5/2006 |
| JP | 2010 021189 |   | 1/2010 |
| JP | 2010021189  | A * | 1/2010 |

* cited by examiner

*Primary Examiner* — Matthew W Such
*Assistant Examiner* — David Spalla
(74) *Attorney, Agent, or Firm* — Edwards Wildman Palmer LLP; David G. Conlin; David J. Silvia

(57) ABSTRACT

A photoelectric conversion device comprises a photoelectric conversion layer; a plurality of structures made of a dielectric substance; and a medium layer for transmitting light interposed between the photoelectric conversion layer and the structures or between the structures, or both, wherein the plurality of structures and the medium layer satisfy $n_{die} > n_{med}$ and $D_{ave} \times n_{med}/\lambda_{max} < 0.3$, wherein $\lambda_{max}$ is a maximal sensitivity wavelength at which the sensitivity of the photoelectric conversion layer to light energy is maximal, $n_{med}$ is a refractive index of the medium layer at the wavelength $\lambda_{max}$, $n_{die}$ is a refractive index of the structures at the wavelength $\lambda_{max}$, and $D_{ave}$ is an average of shortest distances between an light exposure surface of the photoelectric conversion layer and the structures.

7 Claims, 12 Drawing Sheets

(a) cylindrical (b) conical (c) spherical

PHOTOELECTRIC CONVERSION DEVICE

CROSS-REFERENCE TO RELATED APPLICATION

This application is related to Japanese Patent Application No. 2011-128434 filed on Jun. 8, 2011, whose priority is claimed under 35 USC §119, and the disclosure of which is incorporated by reference in its entirety.

BACKGROUND OF THE INVENTION

1. Field of the Invention

The present invention relates to a photoelectric conversion device. More particularly, the present invention relates to a solar cell that converts sunlight into electric energy.

2. Description of the Related Art

In recent years, production costs of photoelectric conversion devices have been reduced and, as a result, photoelectric conversion layers in the photoelectric conversion devices have been thinned. However, a thinned photoelectric conversion layer transmits therethrough a part of incoming light to result in insufficient light absorption. A photoelectric conversion device including a thinned photoelectric conversion layer therefore has a reduced optical energy conversion efficiency. With such a background, there has been developed a technique to form a structure on a surface of the photoelectric conversion device to enhance light absorption in the photoelectric conversion layer.

For example, a solar cell is known in which numerous rod antennas formed from a dielectric substance are provided on a surface of the solar cell body (see Japanese Unexamined Patent Publication No. 2002-76414). The patent document reports that in the solar cell, electromagnetic waves emitted from the sun, that is, sunlight is received efficiently by the rod antennas and the energy thereof is supplied to the solar cell body.

In addition, a photoelectric device is known in which fine particles are dispersed on an upper surface of a photoelectric conversion layer (quantum well structure, for example), and the fine particles each have a composite structure including a dielectric core and a metal shell portion covering an outer peripheral surface of the dielectric core and produce local surface plasmon resonance with two-wavelength light when receiving light (see Japanese Unexamined Patent Publication No. 2010-21189, for example). The patent document discloses that when light of a wavelength causing the local surface plasmon resonance is delivered to the photoelectric device, a high electric field (near-field light) intensified by the local surface plasmon resonance is generated around the fine particles and, as a result, the probability of the light absorption in the photoelectric conversion layer increases to enhance the conversion efficiency of the photoelectric device.

However, conventional solar cells having such rod antennas cannot localize (or concentrate) sunlight to the rod antennas, because the sunlight is supplied into the solar cell by reradiation. In the case of a thinned photoelectric conversion layer, therefore, the sunlight may be transmitted without being sufficiently absorbed by the photoelectric conversion layer. In addition, production of the rod antennas is costly to be likely to hinder cost reduction (for example, production of a larger rod antenna needs more material).

Besides, in the conventional photoelectric device in which fine particles are dispersed on an upper surface of a photoelectric conversion layer, the electric field is not intensified with wavelengths other than the resonance wavelength for the local surface plasmon resonance and the fine particles may block light to form shadows. That is, the resonance wavelength width for the local surface plasmon resonance is narrow, and therefore intensification of the electric field may be limited to a part of the whole sunlight spectrum. Even when a plurality of resonance wavelengths are generated, for example, each fine particle has only one resonance wavelength and will form a shadow with the other wavelengths. Thus, the local surface plasmon resonance may not sufficiently contribute to enhancement of the efficiency of the photoelectric device. Furthermore, production of the metal shell portion, which is mainly made of a noble metal, of the fine particles may be costly.

With the above-described background, a photoelectric conversion device including a thinned photoelectric conversion layer and having a high conversion efficiency is desired. In addition, a photoelectric conversion device that can be produced at low cost is desired.

SUMMARY OF THE INVENTION

In view of the above-described circumstances, the present invention has been achieved to provide a photoelectric conversion device having a high conversion efficiency to which a thinned photoelectric conversion layer can be applied. In addition, the present invention is to provide a photoelectric conversion device that can be produced at lower cost.

The present invention provides a photoelectric conversion device, comprising: a photoelectric conversion layer; a plurality of structures formed from a dielectric substance; and a medium layer for transmitting light interposed between the photoelectric conversion layer and the structures or between the structures, or both, wherein the plurality of structures and the medium layer satisfy $n_{die} > n_{med}$ and $D_{ave} \times n_{med}/\lambda_{max} < 0.3$, wherein $\lambda_{max}$ is a maximal sensitivity wavelength at which the sensitivity of the photoelectric conversion layer to light energy is maximal, $n_{med}$ is a refractive index of the medium layer at the wavelength $\lambda_{max}$, $n_{die}$ is a refractive index of the structures at the wavelength $\lambda_{max}$, and $D_{ave}$ is an average of shortest distances between an light exposure surface of the photoelectric conversion layer and the structures.

According to the configuration of the present invention, the plurality of structures and the medium layer satisfy $n_{die} > n_{med}$, and therefore the light delivered to the photoelectric conversion device generates near-field light localized around the structures when the structures are minute. At the same time, the plurality of structures and the medium layer satisfy $D_{ave} \times n_{med}/\lambda_{max} < 0.3$, and therefore the near-field light around the structures can be absorbed in the photoelectric conversion layer in a concentrated manner. Thus, the conversion efficiency of the photoelectric conversion device is enhanced.

Some conventional photoelectric conversion devices including a thinned photoelectric conversion layer transmit light to fail to absorb light sufficiently. According to the present invention, in contrast, it is possible to enhance the conversion efficiency of the photoelectric conversion device even with a thinned photoelectric conversion layer. In addition, since the dielectric substance absorbs no light or less light compared with metals, the shadows of the structures hardly shade the photoelectric conversion layer. Accordingly, the conversion efficiency of the photoelectric conversion is less likely to be lowered to provide a photoelectric conversion device having a higher conversion efficiency.

In addition, employing the structures formed from the dielectric substance, the present invention allows production at lower cost than production costs of conventional photoelectric devices employing fine particles of noble metals.

As described above, the present invention provides a photoelectric conversion device having a higher conversion efficiency to which a thinned photoelectric conversion layer can be applied. The present invention also provides a photoelectric conversion device that can be produced at lower cost.

DESCRIPTION OF THE PREFERRED EMBODIMENTS

Figure 1:
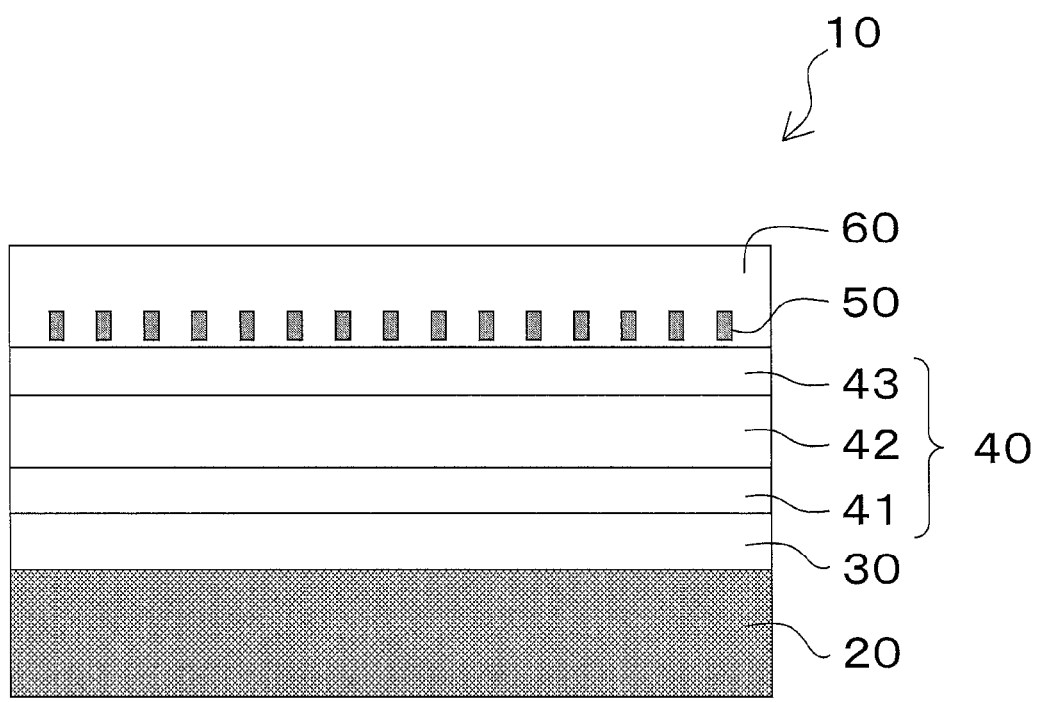
FIG. 1 is a schematic cross sectional view illustrating a configuration of a solar cell according to Embodiment 1 of the present invention.

The present invention provides a photoelectric conversion device comprising: a photoelectric conversion layer; a plurality of structures formed from a dielectric substance; and a medium layer for transmitting light interposed between the photoelectric conversion layer and the structures or between the structures, or both, wherein the structures and the medium layer satisfy the following expressions (1) and (2), $$n_{die} > n_{med} \quad \text{Expression (1)}$$

$$D_{ave} \times n_{med}/\lambda_{max} < 0.3, \quad \text{Expression (2)}$$

wherein $\lambda_{max}$ is a maximal sensitivity wavelength at which the sensitivity of the photoelectric conversion layer to light energy is maximal, $n_{med}$ is a refractive index of the medium layer at the wavelength $\lambda^{max}$, $n_{die}$ is a refractive index of the structures at the wavelength $\lambda_{max}$, and $D_{ave}$ is an average of shortest distances between an light exposure surface of the photoelectric conversion layer and the structures.

According to an aspect, the photoelectric conversion device includes an embodiment in which the structures are formed from a dielectric substance at a light exposure surface side of the photoelectric conversion layer.

According to another aspect, an exemplary embodiment of the photoelectric conversion device comprises the photoelectric conversion layer; the medium layer formed on the photoelectric conversion layer for transmitting the light energy; and the plurality of structures formed from a dielectric substance on the medium layer. Another exemplary embodiment of the photoelectric conversion device comprises the photoelectric conversion layer; and the plurality of structures formed from a dielectric substance on the photoelectric conversion layer. In the configuration of the former exemplary embodiment, the photoelectric conversion layer, the medium layer and the structures are stacked in this order. In the configuration of the latter exemplary embodiment, the photoelectric conversion layer and the structures are stacked in this order, and the medium layer is interposed between the structures. As described above, the medium layer is disposed between the photoelectric conversion layer and the structures and/or between the structures.

The photoelectric conversion device preferably comprises a plurality of structures, because it is preferable that near-field light to be described later is generated over the whole light exposure surface of the photoelectric conversion layer. The plurality of structures are distributed on the medium layer, for example.

In another embodiment of the present invention, in addition to the above-described configuration of the photoelectric conversion device, the structures may satisfy the expression (3) (as well as the expressions (1) and (2))

$$h_{ave} \times n_{die}/\lambda_{max} < 2.5, \quad \text{Expression (3)}$$

wherein have is an average size of the structures in a direction perpendicular to the light exposure surface.

According to the embodiment, the near-field light generated around the structures can be intensified. When the structures are too high, the near-field light may not be generated, but the embodiment allows generation of the near-field light to enhance the conversion efficiency of the photoelectric conversion device.

In addition, the structures according to the embodiment need less material and less production time than structures in a photoelectric conversion device that do not satisfy the expression (3). The embodiment therefore allows production of a photoelectric conversion device at lower cost.

In another embodiment of the present invention, in addition to the above-described configuration of the photoelectric conversion device, the structures may satisfy the expression (4) (as well as the expressions (1) and (2))

$$0.2 < w_{ave} \times n_{die}/\lambda_{max} < 1.5, \quad \text{Expression (4)}$$

wherein $w_{ave}$ is an average size of the structures in a direction horizontal to the light exposure surface.

The photoelectric conversion device in which the structures satisfy the expression (4) may further satisfy the expression (3) described above.

According to the embodiment, the near-field light generated around the structures can be intensified, and generation of a "node" in the electric field of the near-field light can be prevented. Accordingly, the near-field light can be intensified over the whole structures to enhance the conversion efficiency of the photoelectric conversion device.

In an embodiment of the present invention, in addition to the above-described configuration of the present invention, the structures may have a cylindrical shape. Such a shape can be produced by a simple method (can be easily produced by nanoimprint and various lithography techniques, for example).

Alternatively, the structures may have an amorphous shape (can be easily produced by vapor deposition in a gas and cluster deposition, for example).

In an embodiment of the present invention, in addition to the above-described configuration of the present invention, the structures may be formed from GaP or $TiO_2$.

According to the embodiment, GaP or $TiO_2$ can help intensify the near-field light generated around the structures and increase the intensity of light to be absorbed in the photoelectric conversion layer, as having a higher refractive index and a lower absorption index in the sunlight spectral range. Since these substances are semiconductor materials, carrier recombination is prevented at a contact interface in a configuration in which the structures are in contact with the photoelectric conversion layer. When the structures are formed from a metallic substance and brought into contact with the photoelectric conversion layer, carrier recombination occurs at the contact interface, but this embodiment prevents such an adverse effect.

In an embodiment of the present invention, in addition to the configuration of the invention, the photoelectric conversion device may further comprise a pair of electrodes disposed so as to have the photoelectric conversion layer therebetween. For example, the electrodes may be connected respectively to the light exposure surface and the opposite surface of the photoelectric conversion layer, so that the electric energy generated through conversion in the photoelectric conversion layer will be extracted through the electrodes.

In an embodiment of the present invention, in addition to the configuration of the invention, the photoelectric conversion layer, the medium layer and the structures may be stacked in this order to form a photoelectric conversion unit, and a plurality of the photoelectric conversion units may be connected in series and have different maximal sensitivity wavelengths $\lambda_{max}$. In the case of a so-called tandem solar cell, respective photoelectric conversion units convert light at respective wavelengths into electric energy to achieve an enhanced conversion efficiency. Whereas this embodiment further employs the structures suitable for the respective maximal sensitivity wavelengths $\lambda_{max}$ of the respective photoelectric conversion units to achieve a more enhanced conversion efficiency of the photoelectric conversion device.

In an embodiment of the present invention, in addition to the configuration of the invention, surroundings of the structures may be air. For example, the medium layer may be an air layer. Alternatively, the plurality of structures are formed on a plane parallel to the light exposure surface and have air therebetween. More specifically, for example, the photoelectric conversion device according to the embodiment may have a configuration in which the photoelectric conversion layer, the medium layer and the structures (the plurality of structures form a structure layer as a whole) as described above are stacked, and air exists between the structures.

According to the embodiment, the surroundings (for example, the medium layer) of the structures are air whose refractive index n is the smallest (refractive index n=1) to allow material selection for the structures in a broader range. In addition, the near-field light around the structures (i.e., light to be absorbed in the photoelectric conversion layer) can be intensified to allow enhancement of the conversion efficiency of the photoelectric conversion device.

In an embodiment of the present invention, in addition to the configuration of the invention, the medium layer may be provided between the photoelectric conversion layer and the structures, and formed from a transparent electrode material.

According to the embodiment, a large quantity of carriers in the photoelectric conversion layer generated by the near-field light around the structures can be extracted efficiently with the transparent electrode between the photoelectric conversion layer and the structures at the shortest distance from an area where light is concentrated.

Hereinafter, embodiments of the present invention will be described with reference to the drawings. The following description of the embodiments is illustrative of the invention in all aspects and not to be construed as limiting the invention.

Embodiment 1

FIG. 1 is a schematic cross sectional view illustrating a configuration of a solar cell according to Embodiment 1 of the present invention. As illustrated in FIG. 1, a solar cell 10 (photoelectric conversion device) according to the present embodiment comprises a substrate 20, a back surface electrode 30, a photoelectric conversion layer 40, minute dielectrics 50 (structures) and a transparent electrode 60. The photoelectric conversion layer 40, the minute dielectrics 50 (structures) form a photoelectric conversion unit.

The substrate 20 is a thin plate for supporting other components such as the back surface electrode 30 and the photoelectric conversion layer 40. The substrate 20 is formed of a film of glass or resin, for example. Generally, a glass substrate having a thickness of 3 mm to 5 mm is used. Alternatively, a film may be used to give flexibility. The substrate 20 may be nontransparent as being a plate for supporting the photoelectric conversion layer 40 at a side opposite to a light exposure surface side.

The back surface electrode 30 functions to extract electric energy generated through conversion in the photoelectric conversion layer 40 and forms a pair with the transparent electrode 60, having the photoelectric conversion layer 40 between the electrodes. Connected with the photoelectric conversion layer 40 at a substrate-side surface of the photoelectric conversion layer 40, that is, at a surface opposite to the light exposure surface, the back surface electrode 30 does not need to be a transparent electrode. For example, the back surface electrode 30 may be a nontransparent electrode of Al, Ag or the like (metal electrode). Naturally, the back surface electrode 30 may be a transparent electrode formed from a transparent electrode material such as a Ga-doped ZnO, for example. Preferably, a material that allows the back surface electrode 30 to form Ohmic contact with the photoelectric conversion layer 40 (specifically, an n-type semiconductor layer 41 to be described later) is selected because of the function of extracting electric energy from the photoelectric conversion layer 40.

The photoelectric conversion layer 40 functions to convert energy of incoming light into electric energy, for example, convert incoming sunlight into electric energy to generate electricity. In the present embodiment, as illustrated in FIG. 1 by way of example, the photoelectric conversion layer 40 comprises three layers: the n-type semiconductor layer 41, an i-type semiconductor layer 42 and a p-type semiconductor layer 43. In the present embodiment, a p-i-n junction is formed to generate an electric potential gradient for light absorption and carrier separation, thereby producing electric energy.

The photoelectric conversion layer 40 may have any thickness, for example, a thickness of 100 nm or more and 5 μm or less in total, as long as the thickness allows absorption of near-field light generated around the minute dielectrics 50 to be described later. In terms of production costs, for example, a smaller thickness is preferable for cost reduction.

Specific examples of the material of the photoelectric conversion layer 40 include amorphous Si, microcrystalline Si, microcrystalline SiGe, group III-V semiconductors, group II-VI semiconductors, CIGS-based semiconductors and organic semiconductors. For the structure of the photoelectric conversion layer 40, a p-n junction, a bulk heterojunction and quantum dots may be employed as well as the p-i-n junction used in the present embodiment.

The minute dielectrics 50 are constructions (structures) for generating near-field light from light delivered to the solar cell 10 and formed from a dielectric substance such as GaP and $TiO_2$, for example, at the light exposure surface side of the photoelectric conversion layer 40. In the present embodiment, the material of the minute dielectrics 50 is determined in consideration of the relationship with a layer interposed between the photoelectric conversion layer 40 and the minute dielectrics 50 for transmitting incoming light (medium layer) (relationship with the transparent electrode 60 in the present embodiment) according to results of simulations to be described later. Specifically, a material having a higher refractive index than the material of the transparent electrode 60 at $\lambda_{max}$ is selected for the minute dielectrics 50 so as to satisfy the following expression (1) when a wavelength (spectroscopic wavelength) of light that gives the highest photoelectric conversion efficiency in the photoelectric conversion layer 40 is $\lambda_{max}$ (also referred to as maximal sensitivity wavelength):

$$n_{die} > n_{med}, \quad \text{Expression (1)}$$

wherein
$\lambda_{max}$ is a maximal sensitivity wavelength at which the sensitivity of the photoelectric conversion layer to light energy is maximal,
$n_{med}$ is a refractive index of the medium layer at the wavelength $\lambda_{max}$, and
$n_{die}$ is a refractive index of the structures at the wavelength $\lambda_{max}$.

In a case of a simulation to be described later, for example, the material of the minute dielectrics 50 is GaP when the material of the transparent electrode 60 is ITO. Such a material having a higher refractive index than the material of the transparent electrode 60 allows generation of near-field light around the minute dielectrics 50. In the case of light having a wavelength of 600 nm, for example, ITO has a refractive index of 1.8, and GaP has a refractive index of 3.3. (Since the refractive index of a thin film depends on film formation conditions and the wavelength of light, as is well known, the numerical values provided here are merely for exemplification. The same is true of the under-mentioned thin films.)

More specifically, examples of the material of the minute dielectrics 50 include dielectric substances such as GaP, $TiO_2$, $ZrO_2$, $SiO_2$ (details including their refractive indexes will be described along with simulation results). Of these dielectric substances, GaP, $TiO_2$ are preferable as the material of the minute dielectrics 50 in view of the refractive index in the sunlight spectral range and transparency. GaP and $TiO_2$ are semiconductor materials, which do not cause carrier recombination at a contact interface in the case of a configuration where the minute dielectrics 50 are in direct contact with the photoelectric conversion layer 40, unlike the case where the minute dielectrics 50 are formed from a metallic substance.

GaP and $TiO_2$ therefore have no adverse effect on the power generation efficiency of the solar cell. As a thin film, GaP, $TiO_2$ and $ZrO_2$ have a refractive index of 3.3, 2.9 and 2.2, respectively in the case of light having a wavelength of 600 nm, for example.

The shape of the minute dielectrics 50 is not particularly limited, and specific examples thereof include cylindrical, conical and spherical shapes. These shapes allow generation of substantially the same near-field light as will be understood from the simulation results to be described later. Since the minute dielectrics 50 can have any shapes, they can have a random (amorphous) shape including different shapes, for example. Preferably, the shapes of the minute dielectrics 50 satisfy a size (height and width (for example, diameter)) specified from the simulation results.

The number of the minute dielectrics 50 is not particularly limited, but it is preferable to provide a plurality of the minute dielectrics 50 in order to deliver the effect of the near-field light throughout the photoelectric conversion layer 40. For example, the minute dielectrics 50 may be distributed on the light exposure surface of the photoelectric conversion layer 40 as illustrated in FIG. 1. It is preferable that all the minute dielectrics 50 are disposed on a plane having an optimal distance to the light exposure surface (detailed distance and position will be described along with the simulation results to be described later), but they do not need to be disposed on the same plane as long as they can produce the effect.

The transparent electrode 60 functions to extract electric energy generated through conversion in the photoelectric conversion layer 40 as in the case of the above-described back surface electrode 30. The transparent electrode 60 forms a pair with the back surface electrode 30, having the photoelectric conversion layer 40 between the electrodes. Connected with the photoelectric conversion layer 40 at the light exposure surface of the photoelectric conversion layer 40, the transparent electrode 60 needs to be a light-transmitting electrode (for example, transparent electrode), unlike the back surface electrode 30. For example, the transparent electrode 60 may be formed from a transparent conductive material such as ITO and FTO, and have a thickness of several hundred nm to several μm so as to have a not too high resistance and a sufficient transmittance. Preferably, as in the case of the back surface electrode 30, a material that allows the transparent electrode 60 to form Ohmic contact with the photoelectric conversion layer 40 is selected because of the function of extracting electric energy from the photoelectric conversion layer 40 (a material that allows the transparent electrode 60 to form Ohmic contact with the p-type semiconductor layer 43 is preferable, because the transparent electrode 60 is connected with the p-type semiconductor layer 43 that constitutes the photoelectric conversion layer 40).

In the case of the present embodiment, the transparent electrode 60 is configured so as to surround the minute dielectrics 50 and disposed so as to be in contact with the photoelectric conversion layer 40 for efficient extraction of the electric energy generated through conversion in the photoelectric conversion layer 40. Specifically, the transparent electrode 60 is formed on the photoelectric conversion layer 40, and the minute dielectrics 50 are embedded in the transparent electrode 60. More specifically, the transparent electrode 60 is a layer interposed between the photoelectric conversion layer 40 and the minute dielectrics 50 for transmitting incoming light (medium layer). At the same time, the transparent electrode 60 a layer formed over the minute dielectrics 50. At the same time, the transparent electrode 60 fills spaces among the minute dielectrics 50 in a layer of the arranged minute dielectrics 50 (also referred to as minute dielectrics 50 layer (structure layer)).

The minute dielectrics 50 may be positioned against the transparent electrode 60 in such a way that portions of the minute dielectrics 50 are embedded in the transparent electrode 60, for example. However, when portions (for example, lower halves) of the minute dielectrics 50 are embedded in the transparent electrode 60 and the other portions (for example, upper halves) are exposed to the air, that is, when the media (substances) surrounding the minute dielectrics 50 are nonuniform, the near-field light strength is reduced by approximately 10% to approximately 50%. This phenomenon is attributed to the electric field strength nonuniformly distributed in the minute dielectrics 50 due to influence of the substances surrounding the minute dielectrics 50. Accordingly, the minute dielectrics 50 are formed so that the surrounding media (substances) are uniform. For example, when the minute dielectrics 50 are completely embedded in the transparent electrode 60 as described above, the electric energy from the photoelectric conversion layer 40 can be extracted efficiently, and the near-field light can be intensified.

Alternatively, the minute dielectrics 50 may be exposed on a surface of the solar cell 10 without being covered with the transparent electrode 60. In this case, a medium around the minute dielectrics 50 is the air to broaden the range of choices for the material of the minute dielectrics 50. In this case, furthermore, it is preferable that the minute dielectrics 50 are completely exposed on the surface of the solar cell 10 because of the above-described uniformity of the media around the minute dielectrics 50 (for example, the minute dielectrics 50, when having a cylindrical shape, are exposed to the air at all surfaces except for the bottom surfaces contacting with the photoelectric conversion layer 40).

In the solar cell according to the present embodiment, the transparent electrode 60 and the minute dielectrics 50 are configured so as to satisfy the following expression (2). Since the relational expression was derived from the simulation results, the simulations will be described next.

$$D_{ave} \times n_{med}/\lambda_{max} < 0.3, \quad \text{Expression (2)}$$

wherein $\lambda_{max}$ is a maximal sensitivity wavelength at which the sensitivity of the photoelectric conversion layer to light energy is maximal, $n_{med}$ is a refractive index of the medium layer at the wavelength $\lambda_{max}$, and $D_{ave}$ is an average of shortest distances between the light exposure surface of the photoelectric conversion layer and the structures.

[Simulations]

The configuration of Embodiment 1 will be described in detail with reference to the simulation results. FIGS. 2 to 8 are diagrams showing results of simulations of the solar cell 10 according to Embodiment 1 carried out by an FDTD method (finite-difference time-domain method). The simulations were carried out under conditions varied for each diagram. The maximal sensitivity wavelength $\lambda_{max}$ in the photoelectric conversion layer 40 is generally in a range of 500 nm to 800 nm, though varying depending on the semiconductor material and the configuration to employ. The simulations were therefore carried out on the assumption that the maximal sensitivity wavelength is in this range.

Figure 2:
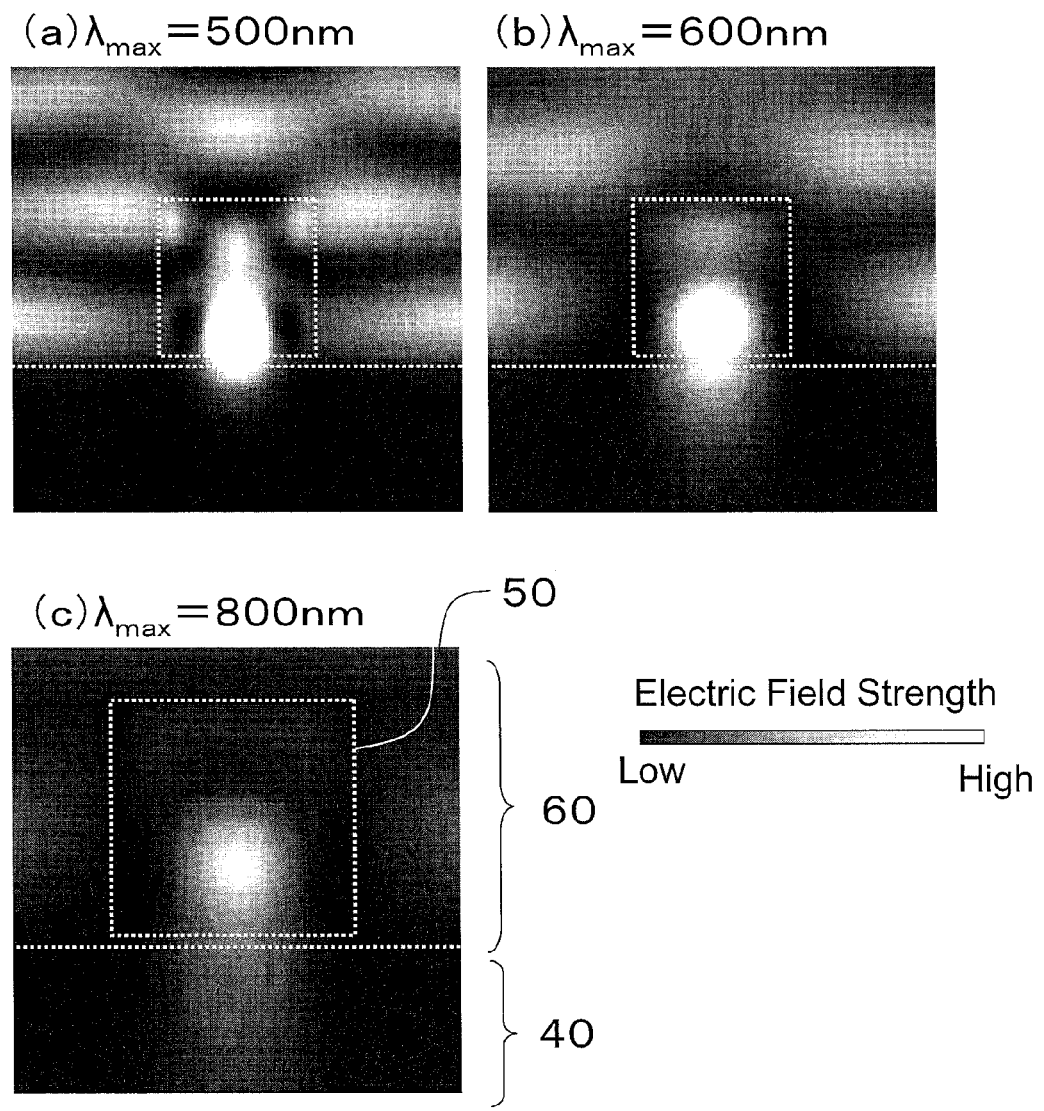
FIG. 2 is diagrams showing distribution of an electric field strength of light around minute dielectrics in simulations.

FIG. 2 is diagrams showing distribution of electric field strength of light around the minute dielectrics in simulations.

The simulations shown in FIG. 2 were carried out on the assumption that the maximal sensitivity wavelength $\lambda_{max}$ in the photoelectric conversion layer 40 is 500 nm, 600 nm and 800 nm to see how the electric field strength of the light around the minute dielectrics 50 would be when light of these wavelengths are delivered to the solar cell 10 of Embodiment 1.

The material of the photoelectric conversion layer 40 was amorphous Si, and the material of the minute dielectrics 50 was GaP. Accordingly, the refractive index $n_{die}$ of the minute dielectrics 50 was a refractive index of GaP at each wavelength $\lambda_{max}$.

The minute dielectrics 50 had a cylindrical shape, and a size of diameter R=200 nm and height h=200 nm in the cases of the wavelengths λ=500 nm and 600 nm, and a size of diameter R=300 nm and height h=300 nm in the case of the wavelength λ=800 nm.

The transparent electrode 60 was formed from ITO, in which the minute dielectrics 50 were embedded. Accordingly, the refractive index $n_{med}$ of the substance surrounding the minute dielectrics 50 was a refractive index of ITO at each wavelength $\lambda_{max}$. The distance from the minute dielectrics 50 to the photoelectric conversion layer 40 was 10 nm, between which ITO was interposed.

FIG. 2 indicates that high-electric field strength regions are generated in the minute dielectrics 50 and at a photoelectric conversion layer 40-side of the minute dielectrics 50, and the light is concentrated toward the photoelectric conversion layer 40. It is understood from the results shown in FIG. 2 that a configuration that allows the photoelectric conversion layer 40 to absorb the concentrated light (near-field light generated around the minute dielectrics 50) will be able to enhance the photoelectric conversion efficiency of the solar cell 10 compared with the case without the minute dielectrics 50. In particular, it is understood that the conversion efficiency can be enhanced in the case where the photoelectric conversion layer 40 is so thin that it does not sufficiently absorb but transmits the light.

Figure 3:
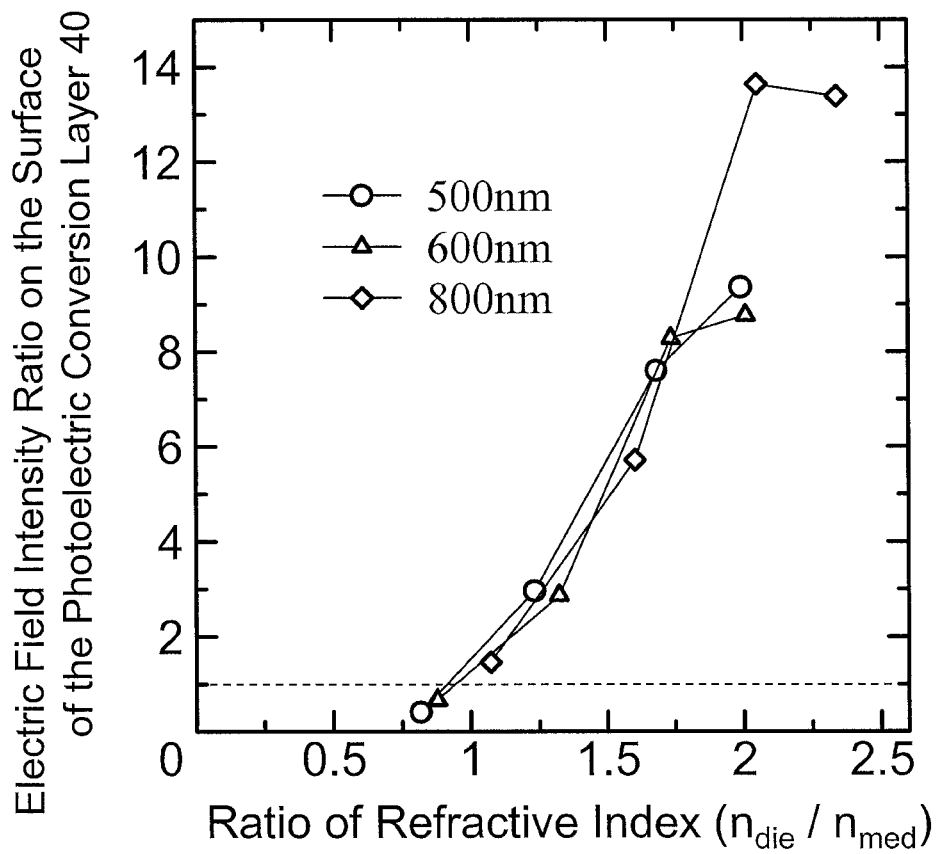
FIG. 3 is a diagram showing the relationship between a refractive index of the minute dielectrics and an electric field strength of light (i.e., near-field light strength) in simulations.

Next, simulations of the specific material of the minute dielectrics 50 were carried out in terms of the refractive index. FIG. 3 is a diagram showing the relationship between the refractive index of the minute dielectrics and the electric field strength of light (i.e., near-field light strength) in the simulations. As the minute dielectrics 50, in the simulations shown in FIG. 3, various kinds of dielectric substances (GaP, $TiO_2$, $ZrO_2$, $SiO_2$) having different refractive indexes were compared in terms of the near-field light strength around the minute dielectrics 50. In order to generally describe the simulation results, the near-field light strength was expressed by an electric field intensity ratio comparing the cases with and without the minute dielectrics 50. (Specifically, the electric field intensity ratio was obtained by dividing the electric field strength on the surface of the photoelectric conversion layer 40 in the case with the minute dielectrics 50 by the electric field strength on the surface of the photoelectric conversion layer 40 in the case without the minute dielectrics 50. The same definition is applicable to the "electric field intensity ratio comparing the cases with and without the minute dielectrics 50" below.) In FIG. 3, the refractive index was normalized as $n_{die}/n_{med}$.

Other than the refractive index described here, the same conditions as in the simulations shown in FIG. 2 were employed.

FIG. 3 indicates that the smaller the refractive index of the minute dielectrics 50 is, the smaller the electric field intensity ratio tends to be at any of the maximal sensitivity wavelengths $\lambda_{max}$ of λ=500 nm, 600 nm and 800 nm. FIG. 3 also indicates that the electric field intensity ratio falls below 1 when $n_{die}/n_{med}<1$. This is considered because near-field light localized on the minute dielectrics 50 is not generated when $n_{die}<n_{med}$. FIG. 3 further indicates that the larger $n_{die}$ is than $n_{med}$, the more the near-field light is concentrated on the minute dielectrics. When $n_{die}>n_{med}$, therefore, the near-field light localized on the minute dielectrics 50 is generated by incoming light. That is, when $n_{die}>n_{med}$, light can be concentrated on the minute dielectrics 50.

Figure 4:
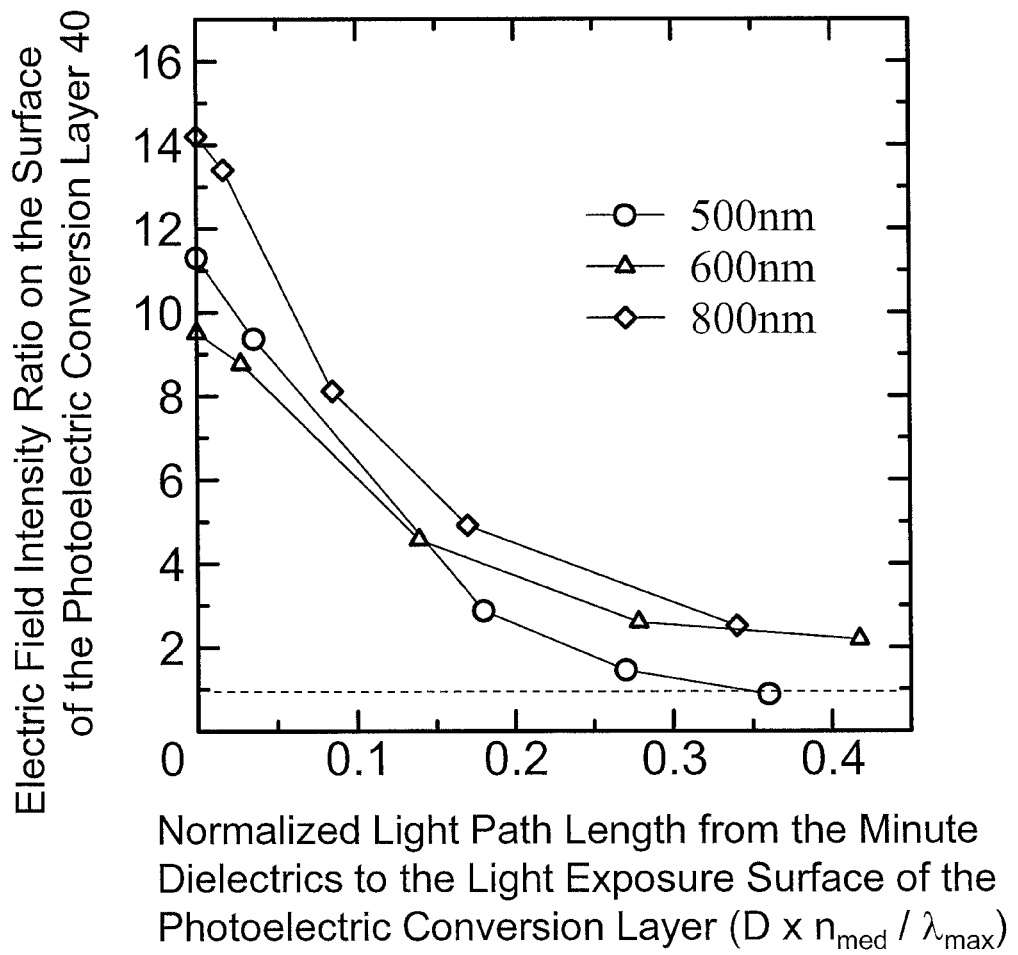
FIG. 4 is a diagram showing the relationship between a distance from the minute dielectrics to a photoelectric conversion layer and an electric field strength of light (i.e., near-field light strength) in simulations.

Next, simulations of the relationship between a distance D from the bottoms of the minute dielectrics 50 to the light exposure surface of the photoelectric conversion layer 40 and the near-field light strength were carried out. FIG. 4 is a diagram showing the relationship between the distance from the minute dielectrics to the photoelectric conversion layer and the electric field strength of light (i.e., near-field light strength) in the simulations. In the simulations shown in FIG. 4, the transparent electrode 60 was formed from ITO and disposed between the bottoms of the minute dielectrics 50 and the photoelectric conversion layer 40. As in the case of FIG. 3, the near-field light strength was expressed by the electric field intensity ratio comparing the cases with and without the minute dielectrics 50. In addition, in FIG. 4, the distance D was expressed by $D \times n_{med}/\lambda_{max}$, normalizing a light path length by wavelength. Other than the distance D described here, the same conditions as in the simulations shown in FIG. 2 were employed.

FIG. 4 indicates that the electric field intensity ratio decreases rapidly as the distance between the minute dielectrics 50 and the photoelectric conversion layer 40 gets larger at any of the maximal sensitivity wavelengths $\lambda_{max}$ of $\lambda=500$ nm, 600 nm and 800 nm. In the case of the maximal sensitivity wavelength $\lambda_{max}=500$ nm, in particular, the electric field intensity ratio is approximately 1 when $D \times n_{med}/\lambda_{max}>0.3$, indicating that the effect of the minute dielectrics 50 is significantly reduced. This is considered because the near-field light generated around the minute dielectrics 50 is prevented from reaching the photoelectric conversion layer 40 when the distance between the minute dielectrics 50 and the photoelectric conversion layer 40 is too large. It is understand from the results shown in FIG. 4 that concentrated light can be absorbed in the photoelectric conversion layer 40 because of the near-field light generated around the minute dielectrics 50 when the distance D between the minute dielectrics 50 and the photoelectric conversion layer 40 satisfies $D \times n_{med}/\lambda_{max}<0.3$. For example, when the maximal sensitivity wavelength $\lambda_{max}$ is 500 nm, the transparent electrode 60 is formed from ITO and the distance D is approximately less than 83 nm, the near-field light can be absorbed in the photoelectric conversion layer 40 (see FIG. 4). The minute dielectrics 50 may have different distances D as long as the average $D_{ave}$ of the distances D satisfies $D_{ave} \times n_{med}/\lambda_{max}<0.3$.

Figure 5:
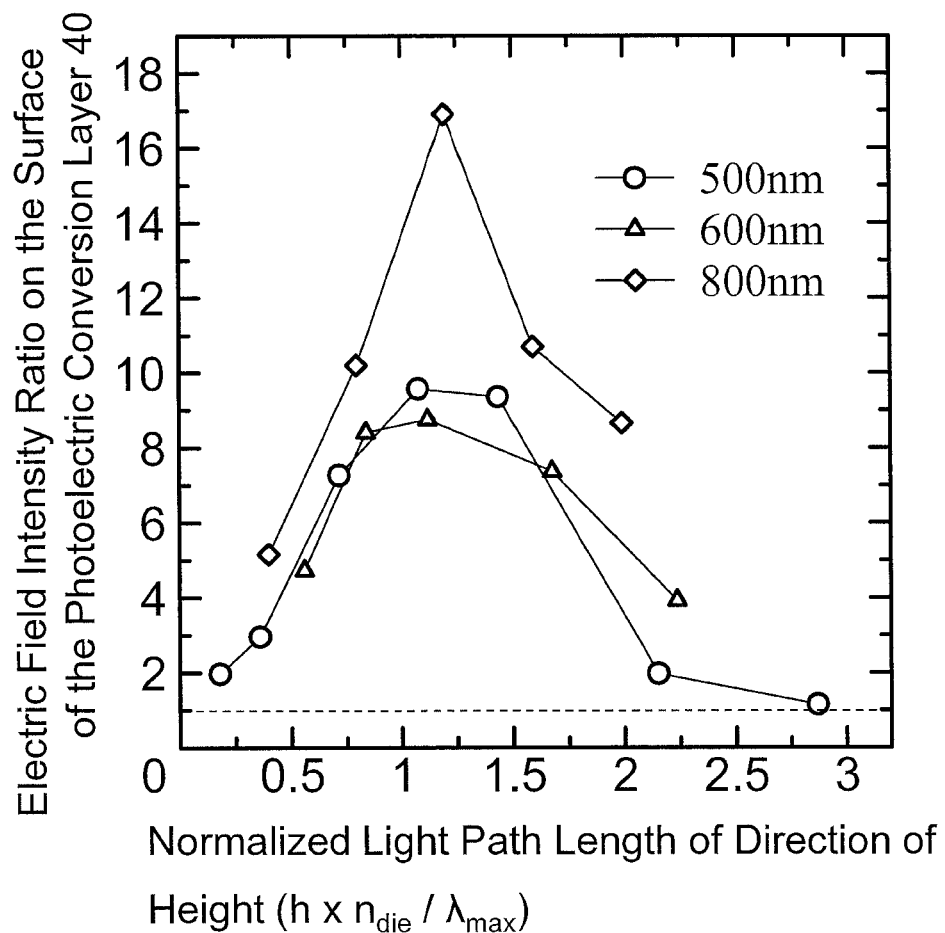
FIG. 5 is a diagram showing the relationship between a height of the minute dielectrics and the electric field strength of light (i.e., near-field light strength) in simulations.

Next, simulations of the relationship between a height h of the minute dielectrics 50 having a cylindrical shape and the near-field light strength were carried out. FIG. 5 is a diagram showing the relationship between the height of the minute dielectrics and the electric field strength of light (i.e., near-field light strength) in the simulations. In the simulations shown in FIG. 5, as in the cases of FIGS. 3 and 4, the near-field light strength was expressed by the electric field intensity ratio comparing the cases with and without the minute dielectrics 50. In addition, in FIG. 5, the height was expressed by $h \times n_{die}/\lambda_{max}$, normalizing a light path length by wavelength.

FIG. 5 indicates that the electric field intensity ratio reaches a peak when the light path length is approximately 1.1 at any of the maximal sensitivity wavelengths $\lambda_{max}$ of $\lambda=500$ nm, 600 nm and 800 nm. In addition, the electric field intensity ratio is approximately 1 when the normalized light path length is longer than 2.5, indicating that the effect of the minute dielectrics 50 is significantly reduced. This is considered because near-field light localized on the minute dielectrics 50 is not generated when the height h of the minute dielectrics 50 is too large. It is understood from the results shown in FIG. 5 that the near-field light generated around the minute dielectrics 50 can be intensified when the height h of the minute dielectrics 50 is in a range of $h \times n_{die}/\lambda_{max}<2.5$. In addition, the height of the minute dielectrics 50 in such a range allows reduction of materials needed for film formation of the minute dielectrics 50 and reduction of production costs. The results shown in FIG. 5 have revealed that it is preferable that the height h is approximately less than 348 nm when the maximal sensitivity wavelength $\lambda_{max}$ is 500 nm and the minute dielectrics 50 are formed from GaP, for example. It is also preferable that the height h is approximately less than 413 nm when the minute dielectrics 50 are formed from $TiO_2$.

Figure 6:
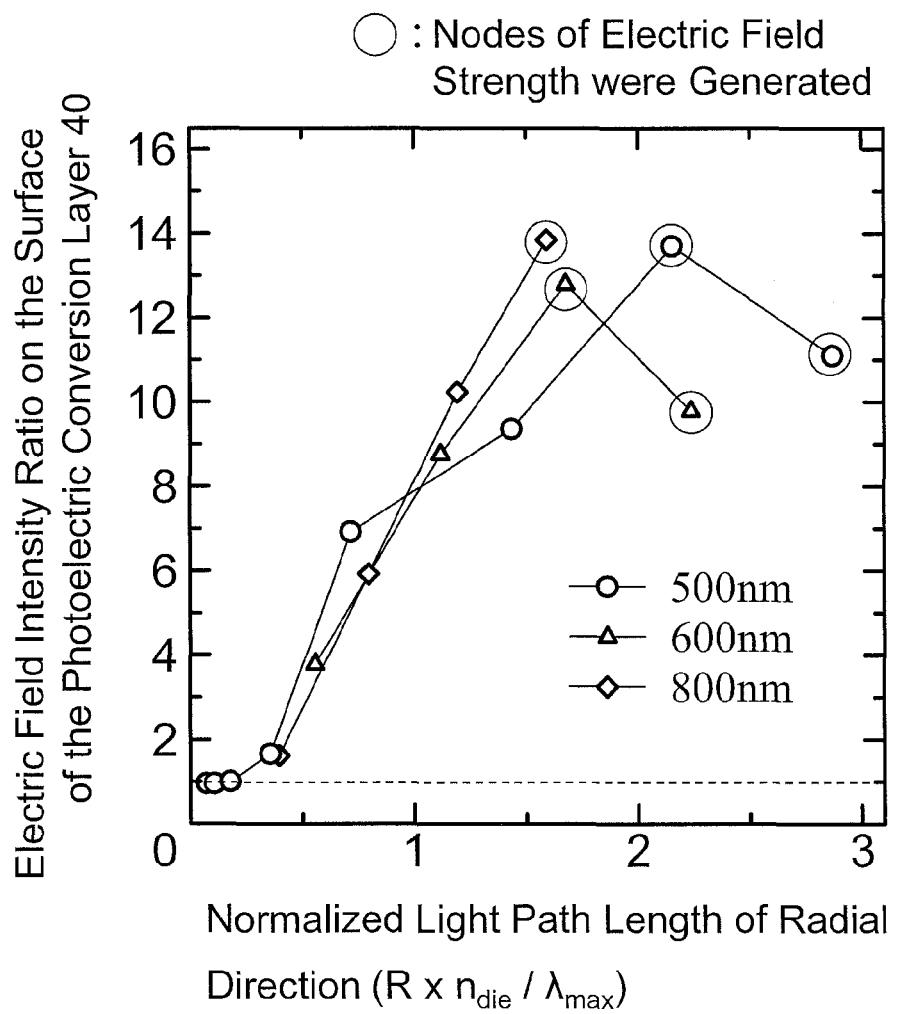
FIG. 6 is a diagram showing the relationship between a diameter of the minute dielectrics having a cylindrical shape and the electric field strength of light (i.e., near-field light strength) in simulations.

Next, simulations of the relationship between a diameter R of the minute dielectrics 50 having a cylindrical shape and the near-field light strength were carried out. FIG. 6 is a diagram showing the relationship between the diameter of the minute dielectrics having a cylindrical shape and the electric field strength of light (i.e., near-field light strength) in the simulations. In the simulations shown in FIG. 6, as in the cases of FIGS. 3 to 5, the near-field light strength was expressed by the electric field intensity ratio comparing the cases with and without the minute dielectrics 50. In addition, in FIG. 6, the diameter R was expressed by $R \times n_{die}/\lambda_{max}$, normalizing a light path length by wavelength.

FIG. 6 indicates that the electric field intensity ratio is approximately 1 when the normalized light path length is in a range of $R \times n_{die}/\lambda_{max}<0.2$ at any of the maximal sensitivity wavelengths $\lambda_{max}$ of $\lambda=500$ nm, 600 nm and 800 nm, indicating that the effect of the minute dielectrics 50 is significantly reduced. This is considered because the electric field cannot go into the minute dielectrics 50 when the diameter R of the minute dielectrics 50 is too small to fail in generation of the near-field light. On the other hand, nodes of the electric field strength were generated in the minute dielectrics 50 as shown in FIG. 6 when the normalized light path length is longer than 1.5 (the nodes of the electric field strength were generated at the points circled in FIG. 6).

Figure 7:
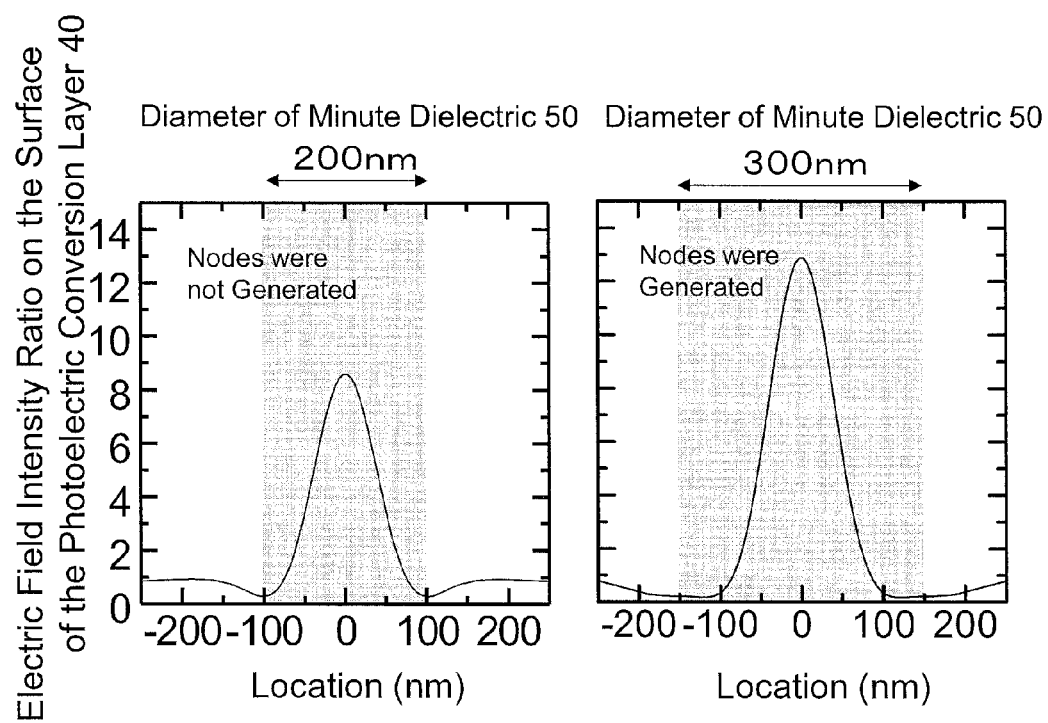
FIG. 7 is diagrams showing influence of a node of the electric field strength generated in the minute dielectrics in simulations.

Next, in order to study influence of the nodes observed in FIG. 6, simulations of how the electric field strength is distributed on the surface of the photoelectric conversion layer 40 right under the minute dielectrics 50 by comparing the case without a node ($\lambda_{max}$: 500 nm, R: 200 nm) and the case with a node ($\lambda_{max}$: 500 nm, R: 300 nm). FIG. 7 is diagrams showing the influence of the node of the electric field strength generated in the minute dielectrics in the simulations. In each graph in FIG. 7, on the assumption that a minute dielectric 50 is positioned in a range represented by an arrow in the center (range colored in gray), the horizontal axis represents the position relative to the minute dielectric 50, and the vertical axis represents the electric field intensity ratio as in the cases of FIGS. 3 to 6.

FIG. 7 indicates that near-field light was obtained all over the minute dielectric 50 in the case without a node (see the left graph in FIG. 7). On the other hand, near-field light was obtained around the center of the minute dielectric 50, but the near-field light is weak around the edge in the case with a node (see the right graph in FIG. 7). The results have revealed that generation of a node reduces the efficiency of the near-field light generation per unit cross section in the minute dielectrics 50. Accordingly, the results shown in FIG. 7 leads to the conclusion that when the diameter R of the minute dielectrics 50 is in a range of $0.2 < R \times n_{die}/\lambda_{max} < 1.5$, it is possible to intensify the near-field light generated around the minute dielectrics 50 and prevent generation of nodes of the electric field in the minute dielectrics 50 in a layer direction of the photoelectric conversion layer 40, so that the near-field light generated around the minute dielectrics 50 can be sent to the photoelectric conversion layer 40 efficiently. When the maximal sensitivity wavelength $\lambda_{max}$ is 500 nm and the minute dielectrics 50 are formed from GaP, for example, the near-field light can be sent to the photoelectric conversion layer 40 efficiently as long as the diameter R is in a range of approximately 28 nm to approximately 209 nm. Alternatively, when the minute dielectrics 50 are formed from $TiO_2$, the near-field light can be sent to the photoelectric conversion layer 40 efficiently as long as the diameter R is in a range of approximately 33 nm to approximately 248 nm (see FIG. 7).

Figure 8:
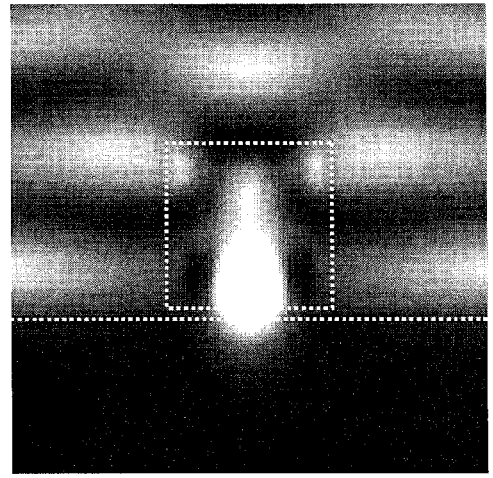
FIG. 8 is diagrams showing the relationship between shapes (cylindrical, conical, spherical) of the minute dielectrics and the electric field strength of light (i.e., near-field light strength) in simulations.
Figure 8:
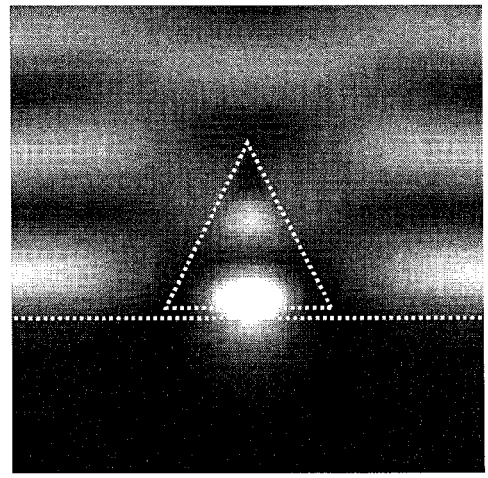
Figure 8:
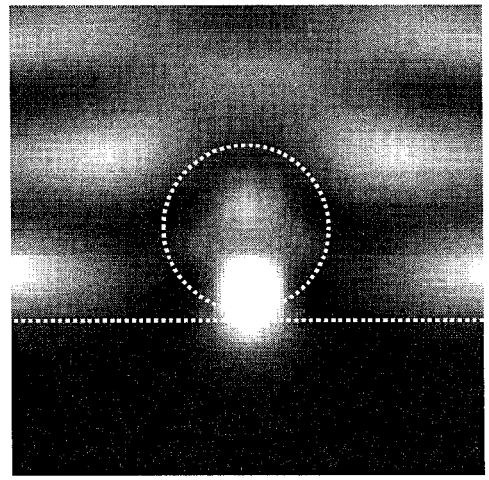

Next, simulations of how the electric field strength of light would be formed around the minute dielectrics 50 in the cases of different shapes (cylindrical, conical, spherical) of the minute dielectrics 50 were carried out. FIG. 8 is diagrams showing the relationship between the shapes (cylindrical, conical, spherical) of the minute dielectrics and the electric field strength of light (i.e., near-field light strength) in the simulations. In FIG. 8, (a) represents the case where the minute dielectrics 50 have a cylindrical shape, (b) represents the case where the minute dielectrics 50 have a conical shape, and (c) represents the case where the minute dielectrics 50 have a spherical shape (the shapes of the minute dielectrics 50 are represented by dotted lines in the diagrams).

FIG. 8 indicates that substantially the same near-field light is obtained regardless of the shape. The results lead to the conclusion that the minute dielectrics 50 may have any shape. For example, the shape may be random (amorphous), including different shapes. When having a random shape, the minute dielectrics 50 have various sizes with a certain average size. Considering the results shown in FIG. 8 in view of the results shown in FIGS. 5 to 7, therefore, the average size of the minute dielectrics 50 should be determined so that the average have is in a range of $h_{ave} \times n_{die}/\lambda_{max} < 2.5$ and the average $w_{ave}$ is in a range of $0.2 < w_{ave} \times n_{die}/\lambda_{max} < 1.5$. Here, the average have is a size of the minute dielectrics 50 in a direction vertical to the surface (light exposure surface) of the photoelectric conversion layer 40 (for example, height), and the average $w_{ave}$ is a size of the minute dielectrics 50 in a direction horizontal to the surface of the photoelectric conversion layer 40 (for example, diameter).

[Production Method 1]

Figure 9:
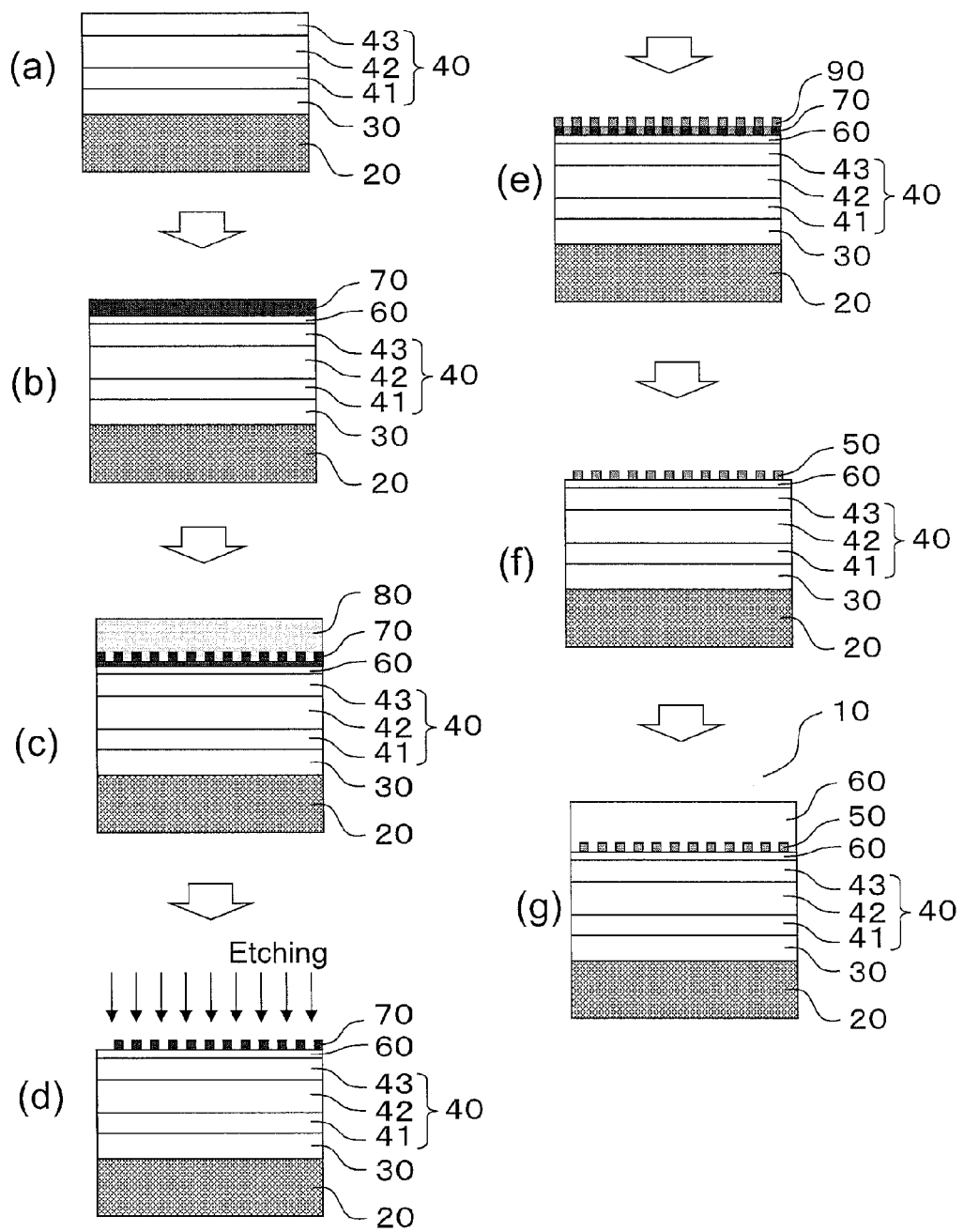
FIG. 9 is diagrams of production steps for illustrating a method for producing the solar cell according to Embodiment 1 of the present invention.

Next, a method for producing the solar cell according to Embodiment 1 will be described. FIG. 9 is diagrams of production steps for illustrating the method for producing the solar cell according to Embodiment 1 of the present invention.

First, the substrate 20 is prepared. Then, on the substrate 20, the back surface electrode 30 is formed by a well-known sputtering method and the photoelectric conversion layer 40 is formed by a well-known PECVD method. For example, an Al thin film is formed as the back surface electrode 30, and semiconductor layers including a p-type amorphous Si layer, an i-type amorphous Si layer and an n-type amorphous Si layer in this order are formed. The methods for the formation of the back surface electrode 30 and the photoelectric conversion layer 40 are not limited to the sputtering method and the PECVD method, and may be any methods well known in the field of metallic thin films and semiconductor thin films. For example, the back surface electrode 30 may be formed by printing a paste of a metal such as Al by a printing method.

According to the above-described step, the substrate 20 having the back surface electrode 30 and the photoelectric conversion layer 40 formed in this order as illustrated in FIG. 9 (a) is produced.

Subsequently, as illustrated in FIG. 9 (b), the transparent electrode 60 is formed on the photoelectric conversion layer 40, and then a resist 70 is formed on the transparent electrode 60. For example, the transparent electrode 60 (ITO thin film, for example) having a thickness of 10 nm to 50 nm is formed by a well-known sputtering method, and then the resist 70 such as PMMA is applied thereon. The film of the resist 70 is formed by a spin coating method or a spray coating method, for example.

Here, the thickness of the transparent electrode 60 formed in the step illustrated in FIG. 9 (b) corresponds to the distance D between the photoelectric conversion layer 40 and the minute dielectrics 50.

Subsequently, as illustrated in FIG. 9 (c), a mold 80 having a predetermined pattern is used to transfer the pattern to the resist 70 (nanoimprint method). Specifically, a desired pattern corresponding to the shape of the minute dielectrics 50 is formed in the mold 80 in advance, and the mold 80 is pressed against a surface of the resist 70. The pattern to be formed in the mold 80 may be regular (for example, a plurality of cylinders uniformly distributed on a plane) or irregular (for example, random shape including different shapes), because the pattern corresponds to the shape and the arrangement of the minute dielectrics 50.

As the method for forming the pattern in the resist 70, other than the nanoimprint method described here, an optical lithography method and an electron lithography method may be used.

Subsequently, as illustrated in FIG. 9 (d), bottoms of recesses of the pattern transferred to the resist 70 are scraped off until the surface of the transparent electrode 60 is exposed. For example, residues of the resist 70 left in the recesses of the pattern are removed by etching such as RIE to expose the surface of the transparent electrode 60.

Subsequently, as illustrated in FIG. 9 (e), a dielectric film 90 is formed on the transparent electrode 60 having the exposed surface and the resist 70. For example, a GaP film is formed by a well-known sputtering method.

Here, the thickness of the dielectric film 90 formed in the step illustrated in FIG. 9 (e) corresponds to the height h of the minute dielectrics 50.

Subsequently, as illustrated in FIG. 9 (f), the resist 70 is removed from the substrate having the dielectric film 90 to form the minute dielectrics 50 on the transparent electrode 60. The resist 70 is removed by a liftoff process, for example. As described above, a substrate on which the minute dielectrics 50 having a desired shape are formed can be obtained.

Subsequently, as illustrated in FIG. 9 (g), another transparent electrode 60 is formed on the substrate having the minute dielectrics 50. The transparent electrode 60 is formed by the same method as in the step illustrated in FIG. 9 (b), for example.

Thus, the solar cell according to Embodiment 1 is completed. According to the production method described here, it is possible to produce a solar cell having the minute dielectrics 50 that are less different in size. When minute dielectrics having a cylindrical shape are formed, in particular, it is possible to produce such a solar cell easily by nanoimprint and various lithography techniques to allow production at lower cost.

When the solar cell according to Embodiment 1 is intended to have a configuration in which the minute dielectrics 50 are exposed on the surface of the solar cell 10, the solar cell is completed by following the steps illustrated in FIG. 9 (a) to FIG. 9 (f) (That is, the step illustrated in FIG. 9 (g) is optional).

[Modification of Production Method 1]

When the solar cell according to Embodiment 1 is intended to have a configuration in which the minute dielectrics 50 have a random shape, a step of forming the minute dielectrics 50 by a fine particle preparation method is employed after the step illustrated in FIG. 9 (b) in place of the steps illustrated in FIG. 9 (c) to FIG. 9 (f). Examples of the fine particle preparation method include vapor deposition in a gas and cluster deposition. Thereby, the minute dielectrics 50 having a random shape can be formed on the surface of the transparent electrode 60. The size and the density of the fine particles can be controlled by controlling gas pressure during the preparation. Alternatively, chemically-synthesized fine particles of the minute dielectrics 50 can be dispersed. By employing such a step, the solar cell 10 in which the minute dielectrics 50 have a random shape can be produced in fewer steps and at lower cost.

Embodiment 2

Figure 10:
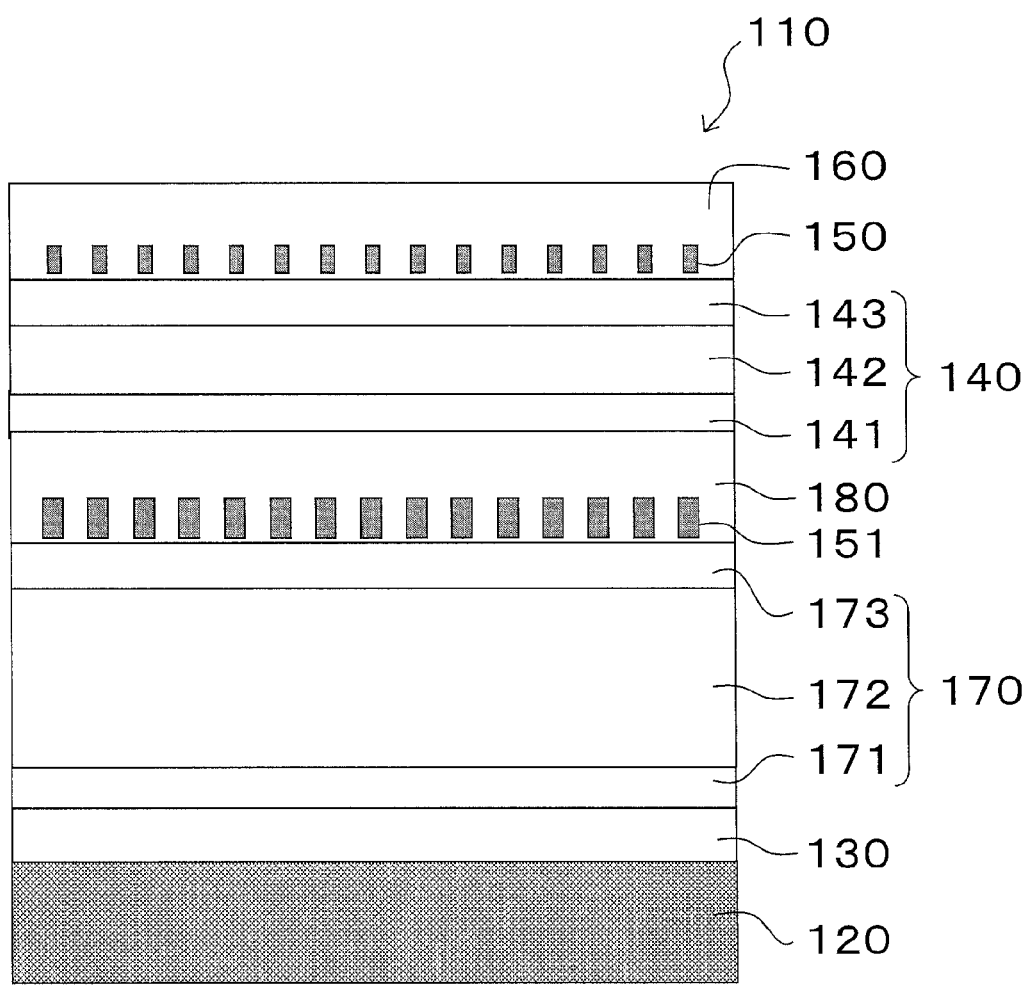
FIG. 10 is a schematic cross sectional view illustrating a configuration of a solar cell according to Embodiment 2 of the present invention.

Next, a solar cell according to Embodiment 2 will be described. The solar cell of Embodiment 1 has one photoelectric conversion unit (photoelectric conversion layer 40 and minute dielectrics 50). On the other hand, when a solar cell has a plurality of photoelectric conversion units and the photoelectric conversion units have different maximal sensitivity wavelengths $\lambda_{max}$ (when a configuration of a so-called tandem solar cell or a so-called multi-junction solar cell is employed), it is possible to achieve a more enhanced photoelectric conversion efficiency of the solar cell. The solar cell according to Embodiment 2 is obtained by applying the above-described configuration of the components including the minute dielectrics 50 to a solar cell having a plurality of photoelectric conversion units. FIG. 10 illustrates the configuration. FIG. 10 is a schematic cross sectional view illustrating the configuration of the solar cell according to Embodiment 2 of the present invention.

As illustrated in FIG. 10, a solar cell 110 (photoelectric conversion device) according to the present embodiment comprises a substrate 120, a back surface electrode 130, a first photoelectric conversion layer 140, first minute dielectrics 150 (first structures), a second photoelectric conversion layer 170, second minute dielectrics 151 (second structures), an interlayer 180 and a transparent electrode 160. The solar cell of Embodiment 1 has the photoelectric conversion unit composed of the photoelectric conversion layer 40 and the minute dielectrics 50 (structures). Whereas the present embodiment (Embodiment 2) has two photoelectric conversion units: the first photoelectric conversion unit composed of the first photoelectric conversion layer 140 and the first minute dielectrics 150; and the second photoelectric conversion unit composed of the second photoelectric conversion layer 170 and the second minute dielectrics 151. The two photoelectric conversion units are joined via the interlayer 180. Hereinafter, components and members that are different from those in Embodiment 1 will be described, while description of the same components and members as in Embodiment 1 will be omitted.

The first and second photoelectric conversion layers 140 and 170 have different maximal sensitivity wavelengths $\lambda_{max}$. The maximal sensitivity wavelength $\lambda_{max}$ can be varied by varying the material for forming the photoelectric conversion layer. For example, the first photoelectric conversion layer 140 may be formed from amorphous Si ($\lambda_{max}$: approximately 500 nm), and the second photoelectric conversion layer 170 may be formed from microcrystalline Si ($\lambda_{max}$: approximately 800 nm). Thus, use of different materials for forming the respective photoelectric conversion layers allows the first photoelectric conversion layer 140 and the second photoelectric conversion layer 170 to have different maximal sensitivity wavelengths $\lambda_{max}$.

Preferably, the first and second minute dielectrics 150 and 151 have different configurations, because the first and second photoelectric conversion layers 140 and 170 have different maximal sensitivity wavelengths $\lambda_{max}$. Specifically, both the first and second minute dielectrics 150 and 151 are configured to satisfy the expression (1) described in Embodiment 1 at the respective maximal sensitivity wavelengths $\lambda_{max}$. More specifically, the first minute dielectrics 150 are formed from a substance having a higher refractive index than the transparent electrode 160 at the relevant maximal sensitivity wavelength $\lambda_{max}$ ($\lambda_{max}$: approximately 500 nm when the first photoelectric conversion layer 140 is formed from amorphous Si), and the second minute dielectrics 151 are formed from a substance having a higher refractive index than the transparent electrode 160 at the relevant maximal sensitivity wavelength $\lambda_{max}$ ($\lambda_{max}$: approximately 800 nm when the second photoelectric conversion layer 170 is formed from microcrystalline Si). For example, they may be formed from dielectric substances such as GaP and $TiO_2$, and configured to satisfy the relationship of the refractive index to intensify near-field light.

In addition, the first and second minute dielectrics 150 and 151 are formed so that the shortest distance D from a surface of each corresponding photoelectric conversion layer satisfies the expression (2) described in Embodiment 1. For example, the distance D from the first photoelectric conversion layer 140 described above to the first minute dielectrics 150 is approximately less than 83 nm ($\lambda_{max}$: approximately 500 nm; the transparent electrode 160 is formed from ITO).

The interlayer 180 is formed from a transparent conductive material as in the case of the transparent electrode 60 so as to transmit light from a first photoelectric conversion layer 140 side to a second photoelectric conversion layer 170 side. Examples of the transparent conductive material include ITO, FTO and ZnO. Since the interlayer 180 also functions to electrically connect the first photoelectric conversion layer 140 and the second photoelectric conversion layer 170, it is preferable that the transparent conductive material is the one that allows formation of Ohmic contact between the first photoelectric conversion layer 140 and the second photoelectric conversion layer 170. Preferably, the film thickness is generally from 50 nm to 2 μm.

The first and second photoelectric conversion layers 140 and 170 compose the respective photoelectric conversion units, each of which is composed of the photoelectric conversion layer, a layer interposed between the photoelectric conversion layer and the minute dielectrics for transmitting light (medium layer), and the minute dielectrics (structures) in this order when seen from a substrate 120 side. When light is delivered to a side of the surface of the transparent electrode 160, therefore, the light first reaches the first photoelectric conversion unit, where light having a specific wavelength is converted into electric energy, and then passes through the interlayer 180 to reach the second photoelectric conversion unit, where light having a different wavelength than the light converted in the first photoelectric conversion unit is converted into electric energy. Since each photoelectric conversion unit satisfies the relational expressions (1) and (2) ($n_{die} > n_{med}$ and $D \times n_{med}/\lambda_{max} < 0.3$), the near-field light is intensified in each photoelectric conversion unit and the conversion efficiency is enhanced in each photoelectric conversion unit to eventually raise the conversion efficiency of the whole photoelectric conversion device.

[Production Method 2]

The solar cell in such a form can be produced by repeating the above-described production method. More specifically, following the steps illustrated in FIG. 9 (a) to FIG. 9 (g), another photoelectric conversion unit is formed on the transparent electrode, which functions as the interlayer 180, formed in the step illustrated in FIG. 9 (g) (for example, a photoelectric conversion unit including a microcrystalline Si film is formed). Subsequently, the steps illustrated in FIG. 9 (b) to FIG. 9 (g) are followed to complete the solar cell 110 of Embodiment 2.

While the form including two photoelectric conversion units is described as Embodiment 2 by way of specific example, it is obvious that the solar cell may include, for example, three or more photoelectric conversion units and the photoelectric conversion units may have different maximal sensitivity wavelengths $\lambda_{max}$.

Embodiment 3

Figure 11:
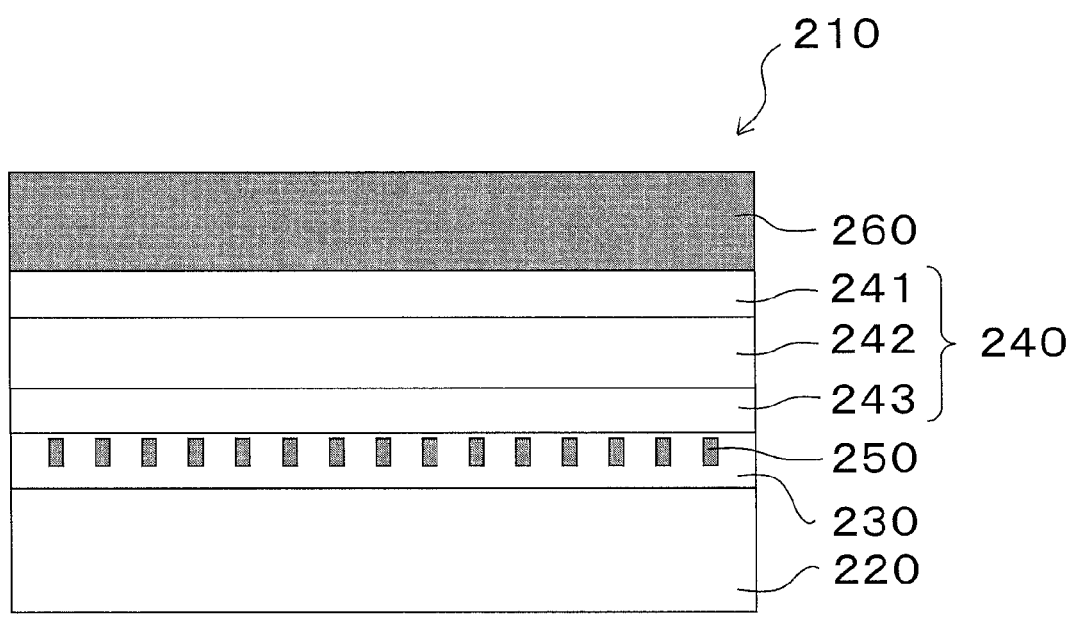
FIG. 11 is a schematic cross sectional view illustrating a configuration of a solar cell according to Embodiment 3 of the present invention.

Next, a solar cell according to Embodiment 3 will be described. Embodiment 1 converts light delivered to the transparent electrode 60 opposite the substrate 20 into electric energy (substrate type). Alternatively, the present invention can be applied to an embodiment that converts light delivered to the substrate into electric energy (superstrate type). FIG. 11 illustrates such an embodiment. FIG. 11 is a schematic cross sectional view illustrating a configuration of the solar cell according to Embodiment 3 of the present invention.

As illustrated in FIG. 11, a solar cell 210 (photoelectric conversion device) according to the present embodiment comprises a substrate 220, a transparent electrode 230, minute dielectrics 250 (structures), a photoelectric conversion layer 240 and a back surface electrode 260. In Embodiment 3, light is delivered to the substrate side, and therefore the substrate-side electrode is a transparent electrode, and the electrode opposite via the photoelectric conversion layer is a back surface electrode, unlike Embodiment 1.

Located at a light exposure side relative to the photoelectric conversion layer 240, the substrate 220 is formed from a material having high transparency in the present embodiment. Examples thereof include glass and a resin film. Generally, a glass substrate having a thickness of 3 mm to 5 mm is used. A film may be used to give flexibility.

The transparent electrode 230 and the back surface electrode 260 correspond to the transparent electrode 60 and the back surface electrode 30 in Embodiment 1, respectively. Accordingly, the transparent electrode 230 and the back surface electrode 260 may be formed from the same materials into the same thicknesses as the transparent electrode 60 and the back surface electrode 30 to fulfill the same functions. For example, the transparent electrode 230 may be formed from a transparent conductive material such as ITO and FTO, and preferably formed from a material that allows the transparent electrode 230 to form Ohmic contact with a p-type semiconductor layer 243. On the other hand, the back surface electrode 260 does not need to be transparent and may be a nontransparent electrode of Al or Ag, for example (metal electrode). The back surface electrode 260 may be a transparent electrode formed from a transparent electrode material (for example, Ga-doped ZnO). Preferably, the back surface electrode 260 is formed from a material that allows formation of Ohmic contact with an n-type semiconductor layer 241.

In addition, the minute dielectrics 250 are embedded in the transparent electrode 230 as in the case of the transparent electrode 60. In the present embodiment, the relationship of the refractive index between the transparent electrode 230 and the minute dielectrics 250, and the positional relationship between the transparent electrode 230, the minute dielectrics 250 and the photoelectric conversion layer 240 are the same as in Embodiment 1. That is, the present embodiment is configured to satisfy the relationships of the expressions (1) and (2) ($n_{die} > n_{med}$ and $D \times n_{med}/\lambda_{max} < 0.3$).

Since the relationships of the expressions (1) and (2) are satisfied, near-field light is intensified in each photoelectric conversion unit, and the conversion efficiency of the solar cell is enhanced even in the above-described embodiment that converts light delivered to the substrate side into electric energy.

[Production Method 3]

Figure 12:
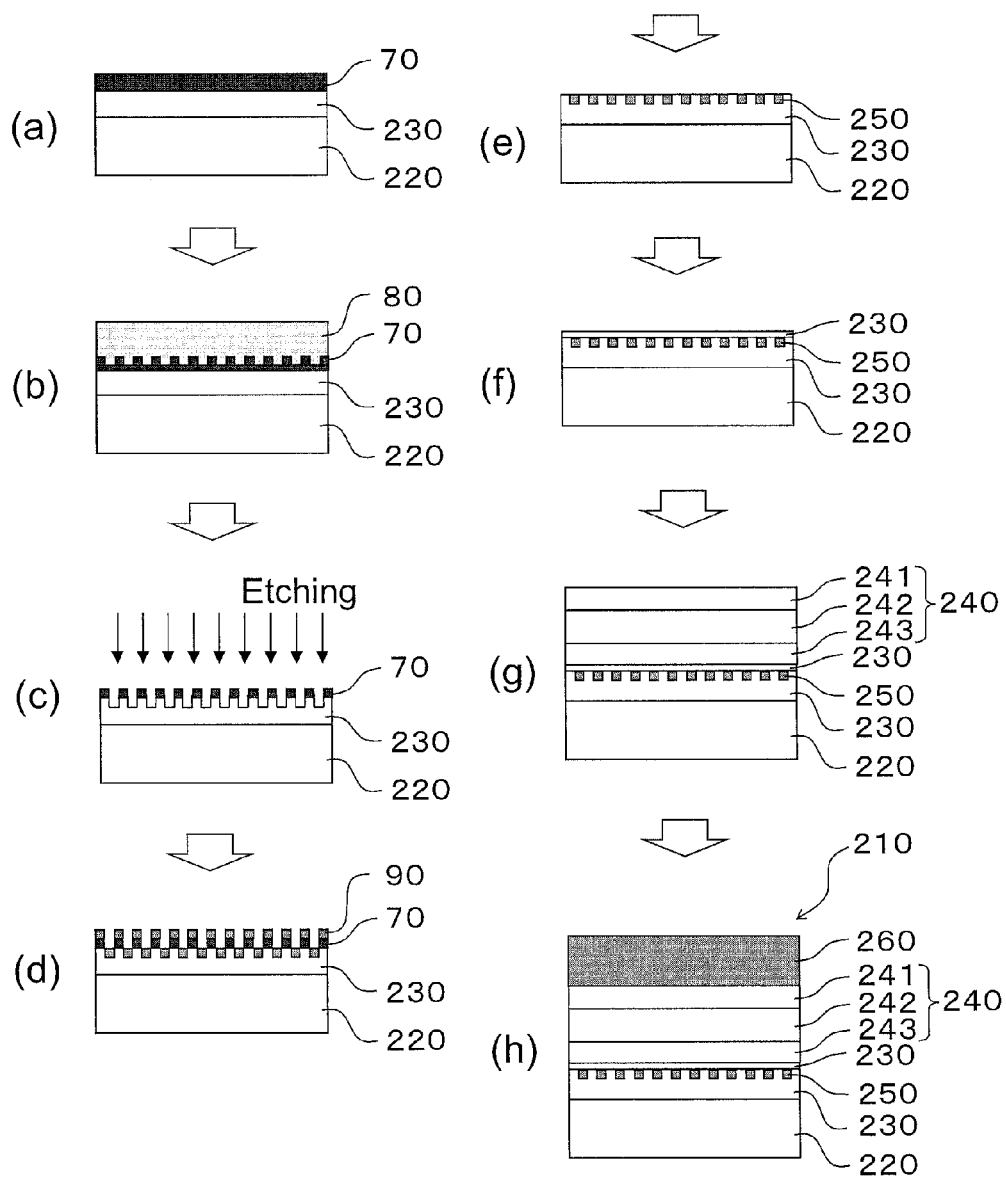
FIG. 12 is diagrams of production steps for illustrating a method for producing the solar cell according to Embodiment 3 of the present invention.

Next, a method for producing the solar cell according to Embodiment 3 will be described. FIG. 12 is diagrams of production steps for illustrating a method for producing the solar cell according to Embodiment 3 of the present invention.

First, the substrate 220 is prepared. Then, the transparent electrode 230 and the resist 70 are formed on the substrate 220 in this order. They can be formed by well-known methods. For example, the transparent electrode 230 is formed by a PECVD method or a sputtering method, and the resist film is formed by a spin coating method or a spray coating method (the same methods as in the solar cell of Embodiment 1 are employed). Thereby, the substrate 220 having the transparent electrode 230 and the resist 70 formed in this order as illustrated in FIG. 12 (a) is produced.

Subsequently, as illustrated in FIG. 12 (b), the mold 80 having a predetermined pattern is used to transfer the pattern to the resist 70 (nanoimprint method). Since the step illustrated in FIG. 12 (b) is the same as the step illustrated in FIG. 9 (c) in the method for producing the solar cell of Embodiment 1, detailed description thereof will be omitted.

Subsequently, as illustrated in FIG. 12 (c), bottoms of recesses of the pattern transferred to the resist 70 are scraped off until the surface of the transparent electrode 230 is exposed, and further the transparent electrode 230 is scraped out to a predetermined depth. That is, the surface of the transparent electrode 230 is chipped according to the pattern transferred to the resist 70 (projections and recesses according to the pattern are formed in the transparent electrode 230). Since the depth of the recesses formed in the transparent electrode 230 will be the height h of the minute dielectrics 250, the transparent electrode 230 is scraped out (chipped) by an amount (to a depth) equal to the height of the minute dielectrics 250.

Subsequently, as illustrated in FIG. 12 (d), the dielectric film 90 is formed so as to fill the recesses formed in the transparent electrode 230. For example, a GaP film is formed by a well-known sputtering method. The film is formed to have a film thickness equal to the depth of the recesses formed in the transparent electrode 230.

Subsequently, as illustrated in FIG. 12 (e), the resist 70 is removed from the substrate having the dielectric film 90 to form the minute dielectrics 250 in the recesses in the transparent electrode 230. The resist 70 is removed by a liftoff process, for example.

Subsequently, as illustrated in FIG. 12 (f), another transparent electrode 230 is formed on the substrate having the minute dielectrics 50. The transparent electrode 230 is formed by a well-known PECVD method or sputtering method.

Subsequently, as illustrated in FIG. 12 (g), the photoelectric conversion layer 240 is formed on the transparent electrode 230. Since the photoelectric conversion layer 240 can be formed in the same manner as in the photoelectric conversion layer 40 of the solar cell according to Embodiment 1, detailed description thereof will be omitted.

Subsequently, as illustrated in FIG. 12 (*h*), the back surface electrode 260 is formed on the photoelectric conversion layer 240 to complete the solar cell 210 according to Embodiment 3.

According to the production method described above, it is possible to produce a solar cell having the minute dielectrics 250 that are less different in size as in the case of the production method of Embodiment 1. When minute dielectrics having a cylindrical shape are formed, it is possible to produce such a solar cell easily by nanoimprint and various lithography techniques to allow production at lower cost as in the case of the production method of Embodiment 1.

The various characteristics shown in the above-described embodiments may be combined with one another. When one embodiment includes a plurality of characteristics, one or more of the characteristics can be appropriately selected to be applied to the present invention independently or in combination. For example, the solar cell according to Embodiment 3 (superstrate type) may be combined with the solar cell according to Embodiment 2 (tandem type). An embodiment based on such an appropriate combination of technical means disclosed in the different embodiments is encompassed in the technical scope of the present invention.

What is claimed is:

1. A photoelectric conversion device, comprising:
   a photoelectric conversion layer;
   a plurality of structures made of a dielectric substance; and
   a medium layer for transmitting light interposed between the photoelectric conversion layer and the structures and between the structures so as to contact with the photoelectric conversion layer, wherein
   the plurality of structures and the medium layer satisfy $n_{die} > n_{med}$ and $D_{ave} \times n_{med}/\lambda_{max} < 0.3$, wherein $\lambda_{max}$ is a maximal sensitivity wavelength at which the sensitivity of the photoelectric conversion layer to light energy is maximal, $n_{med}$ is a refractive index of the medium layer at the wavelength $\lambda_{max}$, $n_{die}$ is a refractive index of the structures at the wavelength $\lambda_{max}$, and $D_{ave}$ is an average of shortest distances between the structures and an interface between the photoelectric conversion layer and the medium layer,
   wherein the plurality of structures satisfy $h_{ave} \times n_{die}/\lambda_{max} < 2.5$ wherein $h_{ave}$ is an average size of the structures in a direction perpendicular to the interface, and
   wherein the plurality of structures satisfy $0.2 < w_{ave} \times n_{die}/\lambda_{max} < 1.5$, wherein $w_{ave}$ is an average size of the structures in a direction horizontal to the interface.

2. The photoelectric conversion device according to claim 1, wherein each of the structures has a cylindrical shape.

3. The photoelectric conversion device according to claim 1, wherein the plurality of structures are made of GaP or $TiO_2$.

4. The photoelectric conversion device according to claim 1, wherein the medium layer is an air layer.

5. The photoelectric conversion device according to claim 1, wherein the medium layer is provided between the photoelectric conversion layer and the structures, and made of a transparent electrode material.

6. The photoelectric conversion device according to claim 1, further comprising a pair of electrodes disposed so as to have the photoelectric conversion layer therebetween.

7. The photoelectric conversion device according to claim 1, comprising a plurality of photoelectric conversion units each having the photoelectric conversion layer, the medium layer and the structures stacked in this order, wherein the photoelectric conversion units are connected in series and have different maximal sensitivity wavelengths $\lambda_{max}$.

* * * * *